United States Patent
Fowler et al.

(10) Patent No.: US 11,678,457 B1
(45) Date of Patent: Jun. 13, 2023

(54) MODULE RETENTION IN AN ELECTRONICS CHASSIS

(71) Applicants: Eagle Technology, LLC, Melbourne, FL (US); Senior Operations LLC, Bartlett, IL (US)

(72) Inventors: Clarke O. Fowler, Merritt Island, FL (US); Patrick Bradley Reed, Franklin, MA (US)

(73) Assignees: EAGLE TECHNOLOGY, LLC, Melbourne, FL (US); SENIOR OPERATIONS LLC, Bartlett, IL (US)

( * ) Notice: Subject to any disclaimer, the term of this patent is extended or adjusted under 35 U.S.C. 154(b) by 0 days.

(21) Appl. No.: 17/592,139

(22) Filed: Feb. 3, 2022

(51) Int. Cl.
 *H05K 7/14* (2006.01)
 *H05K 7/20* (2006.01)
(52) U.S. Cl.
 CPC ....... *H05K 7/1489* (2013.01); *H05K 7/20545* (2013.01)
(58) Field of Classification Search
 None
 See application file for complete search history.

(56) References Cited

U.S. PATENT DOCUMENTS

| | | | | |
|---|---|---|---|---|
| 5,813,876 A | * | 9/1998 | Rutigliano | G01R 31/2808 439/260 |
| 2007/0253169 A1 | * | 11/2007 | Clawser | H05K 7/20545 361/720 |
| 2017/0248994 A1 | * | 8/2017 | Pruett | G06F 1/20 |
| 2019/0230808 A1 | * | 7/2019 | Ditri | H05K 7/20672 |

\* cited by examiner

*Primary Examiner* — James Wu
*Assistant Examiner* — Christopher L Augustin
(74) *Attorney, Agent, or Firm* — Fox Rothschild LLP

(57) ABSTRACT

A module is retained in a slot of an electronics chassis. A clearance space is provided for receiving the module in a slot of the electronics chassis by controlling an internal pressure of a bellows. The bellows forms a part of a retainer that is disposed on an elongated rail extending along a length of the slot. The bellows defines an internal bellows capsule which contains a fluid. Once the module has been inserted in the slot, the module is secured with the retainer by further controlling the internal pressure of the bellows to exert a force on the module.

21 Claims, 7 Drawing Sheets

MODULE RETENTION IN AN ELECTRONICS CHASSIS

BACKGROUND

Statement of the Technical Field

The present document concerns electronic systems. More specifically, the present document concerns implementing systems and methods for retaining modules in a chassis.

Description of the Related Art

Many communications systems, especially those intended for use in mobile platforms, must be environmentally robust both in terms of their hardware and signaling format. One of the conventional architectures employed by suppliers of such systems is the Versa Module Europa or VME bus. RF signaling circuits and digital signaling modules built to the VME standard are designed to plug into a chassis defined by discrete connector slots. As such, these modules must conform with conventional standard mechanical form factors (e.g., 3 U and 6 U) including relatively tight dimensional spacing between the connector slots of the VME bus. VPX (which is also known as VITA 46) is the next generation system which extends the VME bus concept. The VITA 46.0-2007 standard specifies the basic mechanical and electrical specifications for VPX including the mechanical interface between the chassis and the plug-in modules.

The chassis slots in a conventional VPX chassis are partially defined by elongated rails disposed along the chassis walls. The rails can help guide and support the modules in alignment with VPX bus connectors when a module is inserted into a particular slot. The VPX standard allows for conduction cooling panels which extend adjacent to the plug-in modules when they are inserted in chassis slots. In such scenarios, the rails can serve an important thermal management function. When installed in a slot, a thermal interface portion of each module is clamped firmly against one of the chassis rails to facilitate thermal energy transfer from the module to the conduction cooling panel. These systems rely upon conventional module retainer clamps to provide the necessary clamping force. Conventional module retainers are complex assemblies of movable segments that expand the retainer profile when a shaft is turned with a tool. These types of module retainers are sometimes referred to as a wedge-lock type of retainer system. The expansion of the retainer profile causes a module thermal interface portion of the plug-in module to press against a chassis rail interface. The direct contact between the module thermal interface portion and the chassis rail interface facilitates conduction cooling.

In direct thermal conduction systems as described, thermal performance is related to the amount of force exerted by the module thermal interface portion on the chassis rail interface. Increasing the magnitude of clamping force exerted by the module retainer results in improved thermal performance. However, the magnitude of such clamping force as applied by conventional wedge-lock module retainers will tend to decrease over time as the number of insertion/extraction cycles is increased. This decrease in clamping force will negatively affect thermal performance.

To overcome the problem of decreasing clamping force in typical wedge-lock style retainers such devices require hand tightening a component with a tool. The component must be tightened to a specified torque to achieve the desired clamping force. But many maintenance requirements prohibit torque wrenches, and some entirely prohibit the use of tools. All of the foregoing issues result in wedge-lock style retainers having a clamping force which varies from module to module and between maintenance cycles. Maintainers may also forget to tighten retainers. Such an oversight can result in a failure of the plug-in module due to inadequate thermal management. Conventional wedge-lock retainers are also known for problems with binding which can disallow removal of a module from a chassis and thereby negatively affect MTTR (mean time to repair).

SUMMARY

Embodiments concern a method and system for retaining an electronics module in a slot of a chassis. The method involves creating a clearance space for receiving a module in a slot of an electronics chassis by controlling an internal pressure of a bellows which forms a part of a retainer that is disposed on an elongated rail extending along a length of the slot. The bellows defines an internal bellows capsule which contains a fluid. Once the module has been inserted in the slot, the module is secured with the retainer by further controlling the internal pressure of the bellows to exert a force on the module. The force exerted by the bellows on the module can be produced by one or both of a spring force developed by the bellows and/or a hydraulic force produced by the pressure within the bellows capsule. According to one aspect, the fluid described herein can be used to concurrently control the internal pressure of at least a second bellows associated with a second retainer disposed on a second elongated rail of the chassis.

The internal pressure of the bellows is advantageously controlled by using a pump. In some scenarios, the pump can be integrated with or mounted to the chassis. Control of the internal pressure can also be facilitated by selectively varying a condition of a pressure relief valve. For example, the pressure relief valve can be closed to maintain an internal fluid pressure within the bellows, or open to equalize the fluid pressure with the pressure of a surrounding environment.

In some scenarios, the method can also involve using the bellows to help cool the module. As such, the material forming the bellows can be selected to be a highly thermally conductive material. For example, in some scenarios the highly thermally conductive material can be a metal. In such a scenario, the bellows can be used to help conductively cool the module by transferring thermal energy through the bellows, from a thermal interface of the module to the elongated rail. The fluid used to control the bellows is comprised of a base fluid. When the bellows is used to facilitate conductive cooling, a thermal conductivity of a fluid path through the bellows can be enhanced by adding at least one of a metallic and a non-metallic nanoparticles to the base fluid.

Embodiments also include an electronics chassis. The chassis includes at least one slot of predetermined size and shape which is disposed between opposing first and second chassis walls for receiving therein a specified module. A retainer is disposed in the at least one chassis slot. The retainer is advantageously comprised of a bellows which is positioned in the slot. The bellows in a first state has a first bellows length which facilitates a clearance space within the slot for receiving the specified module. In a second state the bellows has a second bellows length which is greater than the first bellows length, whereby a force can be exerted on a portion of the specified module when the module is in the slot. In some embodiments, the bellows can be formed of a metal or a polymer.

To facilitate the transition between the first and second state, the bellows has an internal bellows capsule configured for containing a fluid. The bellows is configured to transition from the first state to the second state responsive to a change in pressure of the fluid in the bellows capsule. The fluid can be comprised of a base fluid and at least one of a metallic and a non-metallic nanoparticles which enhance a thermal conductivity of the base fluid.

According to one aspect, each slot provided in the electronics chassis is at least partially defined by a plurality of rails which extend along the first chassis wall. Further, the retainer described herein can be disposed on a first face of a first rail. The retainer in such position is opposed from a second face of a second rail, and the clearance space is the space between the retainer and the second face.

The electronics chassis can also include a fluid control system which is configured to control the fluid pressure within the bellows capsule. The fluid control system is comprised of one or more components which can include a pump, a fluid manifold, a fluid reservoir, and a pressure relief valve. In some scenarios, the pump can be fixed to the chassis to facilitate the operation of the retainer. The pump can be a manually operated pump or can be operated by a motor. The pressure relieve valve can be configured to allow the fluid pressure in the bellows capsule to be equalized with an environment in which the system is disposed. The manifold can comprise at least one fluid pathway formed in the first chassis wall and coupled to the bellows capsule of one or more retainers. With the foregoing configuration, pressurized fluid in the manifold can flow into and out of the bellows capsule of one or more bellows. In some scenarios, a fluid pathway which may be an extension of the manifold can further extend through the first rail.

In the retainer described herein, the bellows can in some scenarios be a spring which is capable of exerting a spring force. As such, the force that is exerted by the retainer on a portion of the specified module when the module is in the slot can be produced by a fluid pressure within the bellows capsule and/or the spring force exerted by the bellows.

BRIEF DESCRIPTION OF THE DRAWINGS

Embodiments will be described with reference to the following drawing figures, in which like numerals represent like items throughout the figures, and in which.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

Embodiments disclosed herein may provide certain advantages in an electronics platform or chassis system in which circuit modules are designed to plug into discrete slots to form electrical connections. To conform to a particular standard modules of this type often must conform with well-defined mechanical form factors including relatively tight dimensional spacing between the connector slots of the bus. An example of a standard bus concept of this type is the VPX standard (also known as VITA 46) in which the VITA 46.0-2007 standard specifies the basic mechanical and electrical specifications for the mechanical interface between the chassis and the plug-in modules. In some scenarios, a chassis system as described can provide for conduction cooling panels which extend adjacent to elongated edges of the plug-in modules when the plug-in modules are inserted in the bus. In such systems, module retainers can provide a clamping force to firmly press a module thermal interface disposed along an edge of each module against a chassis rail disposed on the cooling panel. The clamping force provided by the module retainers can facilitate module thermal management and retains the module when it is installed in the chassis. With regard to thermal management, heat from the module is transported to the chassis through direct contact force between the module thermal interface and the chassis rail. A certain amount of thermal energy may also be transferred from the module to the chassis through the module retainer. However, a conventional wedge lock retainer presents a tortuous thermal path due to the design of the clamp. Consequently, the wedge lock retainer is not very efficient for purposes of facilitating thermal energy transfer.

Figure 1:
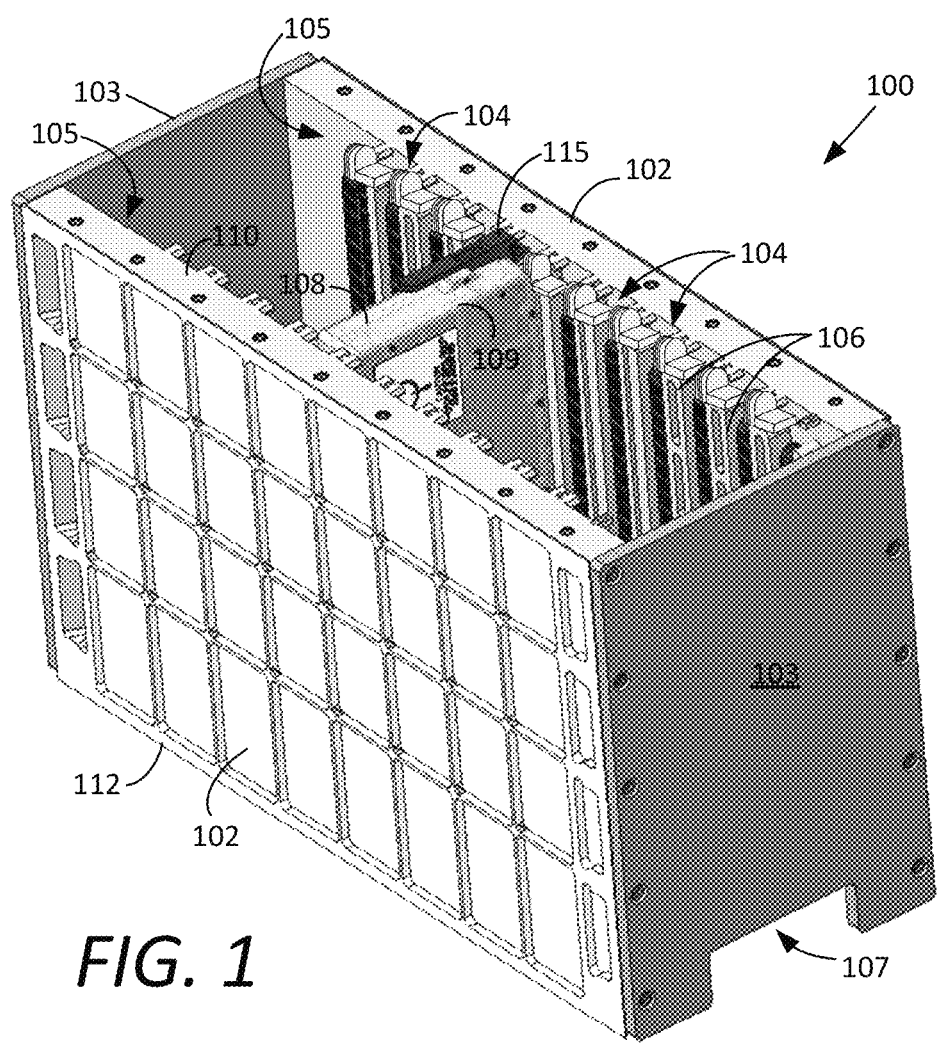
FIG. 1 is a drawing which is useful for understanding an arrangement of an electronics chassis which includes one or more slots for receiving plug-in modules.
Figure 2:
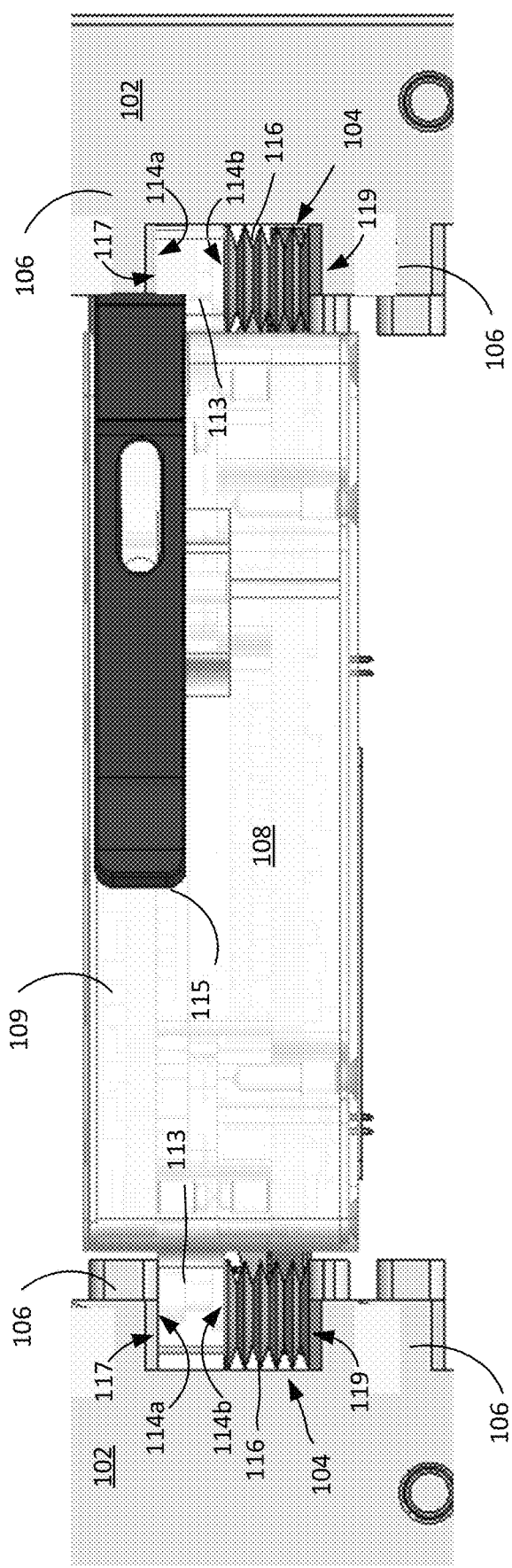
FIG. 2 is a drawing which is useful for understanding how a plug-in module is received in a slot of the electronics chassis.
Figure 3C:
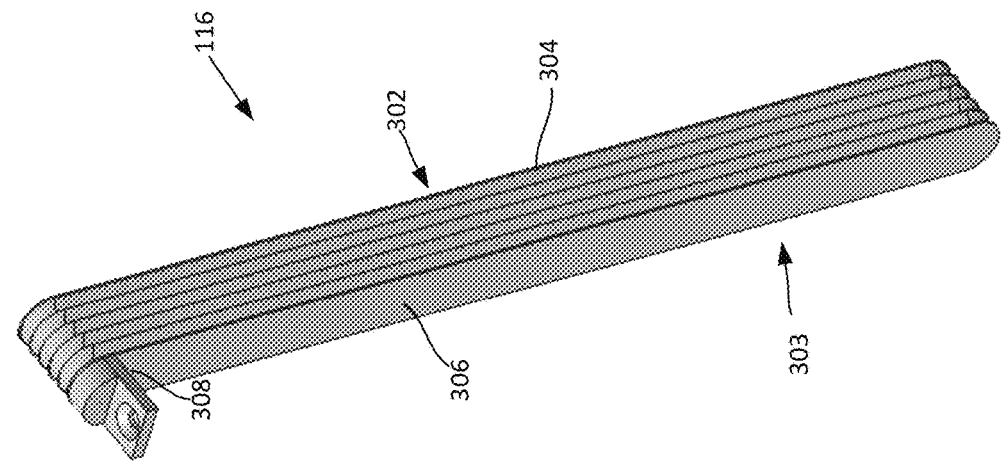
FIGS. 3A-3C are a series of drawings which show a type of bellows which can be used for module retention and thermal conduction in an electronics chassis.
Figure 3B:
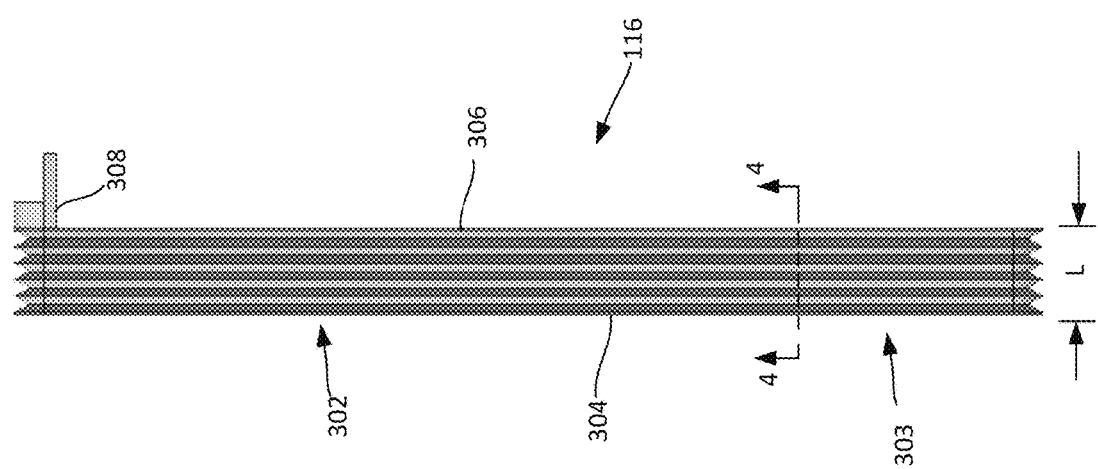
Figure 3A:
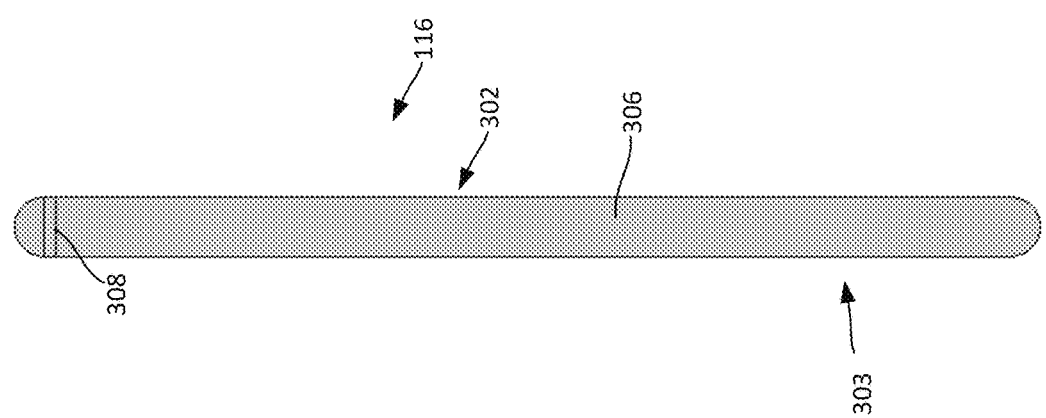
Figure 4:
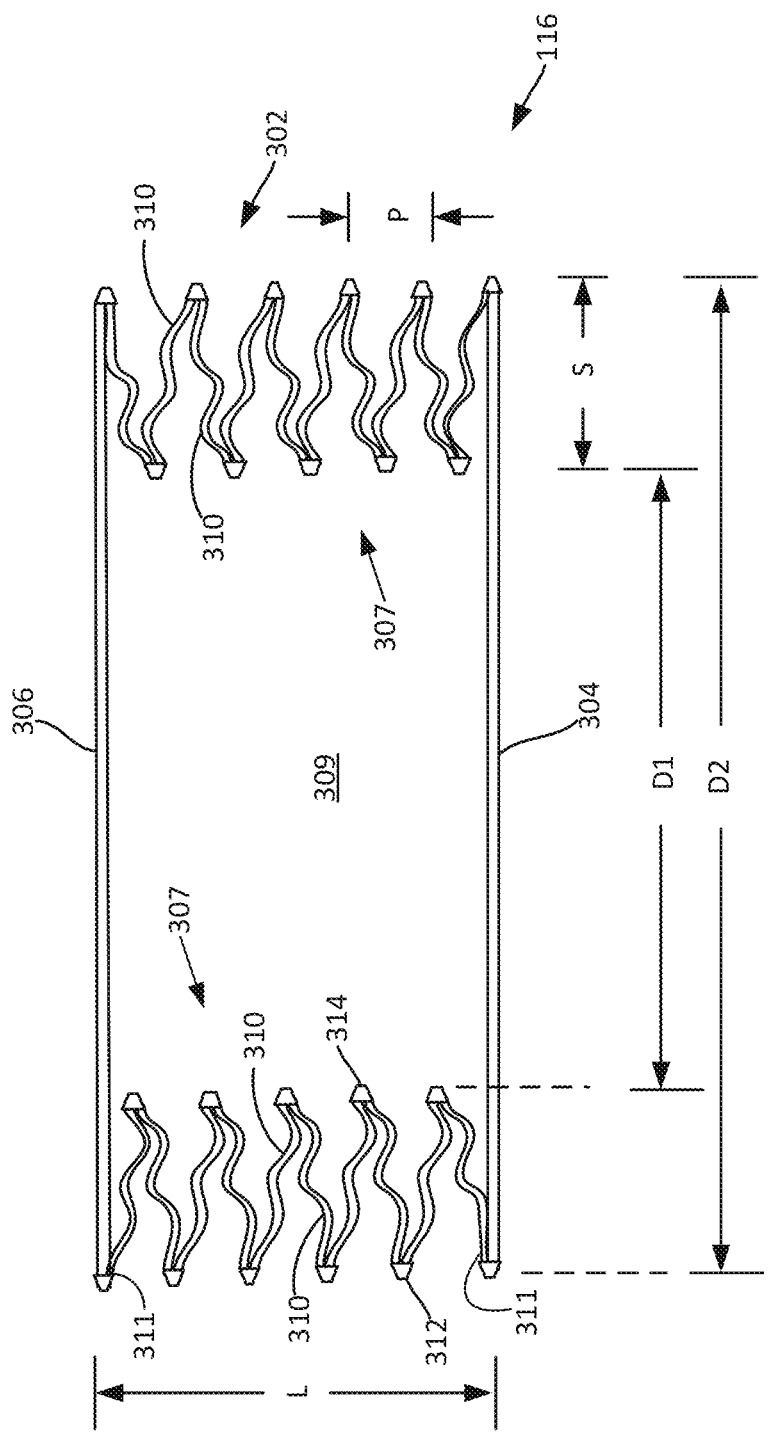
FIG. 4 is a cross-sectional view of the bellows taken along line 4-4.

A solution disclosed herein comprises an electronics chassis including a module retainer system and method which overcomes many of the limitations of conventional arrangements. With reference to FIGS. 1 and 2 it can be observed that an electronics chassis 100 can be comprised of opposing side panels 102 and opposing end panels 103. The side panels 102 are formed of a rigid material and can include an inner face 105 on which a plurality of rails 106 are disposed extending from a first portion 110 to an opposing second portion 112 of each side panel. These rails 106 are advantageously arranged in parallel spaced relation on each inner face 105 to form a series of slots 104. Each slot 104 can be designed to receive therein an electronics module 108 having a module body 109 of generally rectangular shape. The configuration of the rails and the slots are designed to receive elongated guide members 113 which help maintain a position of each module in the chassis. A grasping handle 115 can be provided fixed to the module body 109 to aid users with inserting and removing the module from the slot 104. A bus panel 107 can be disposed between the opposing side panels and extending between the second portion of each side panel. According to one aspect, the bus panel may include one or more electronics connectors and/or mechanical alignment devices for mating with a module. In some scenarios, the overall size and shape of the electronics chassis and modules inserted therein can be conformed at least in part to a VME or VPX bus standard.

The side panels 102 can comprise a cooling wall or cold wall which interacts with a planar face of a thermal interface portion of each module to facilitate conduction cooling. The interaction of module 108 with rails 106 is shown in greater detail in FIG. 2 which shows elongated guide members 113 disposed on opposing sides of the module body 109. In some scenarios, the guide members 113 can include one or more planar faces 114a, 114b which comprise a thermal interface portion of the elongated guide members. The planar face 114a can engage directly with a rail face 117 to position the module in the chassis and facilitate thermal energy transfer. Planar face 114b advantageously engages with an elongated face of retainer 116. Retainer 116 is disposed on rail face 119 opposed from rail face 117. The retainers 116 advantageously secure the module in the slot 104 and can also facilitate conduction cooling.

Certain features of the retainer 116 are shown in greater detail in FIGS. 3A-3C and FIG. 4. The retainer 116 is comprised of a corrugated body 302 having first and second opposing end faces 304, 306. The corrugated body together with the end faces define a bellows 303 having a bellows length L. The bellows length L can vary in accordance with a fluid pressure of a fluid (not shown) disposed in a bellows capsule 309 defined internal of the corrugated body. The exact configuration of the bellows can be varied by a designer in accordance with the requirements of a particular scenario. In some scenarios, the corrugated body is comprised of a stack 307 of contoured plates 310, each having a predetermined thickness and having a span S. The corrugated plates are joined at a crest portion 312 and a root portion 314 so that the corrugated body has an inner diameter D1 and an outer diameter D2. At opposing end portions 311 each stack 307 is respectively joined to an end face 304, 306 to enclose the capsule. The corrugated body and the end faces which define the bellows can be formed of a suitable material such as a metal or polymer. If the retainer is intended to facilitate heat transfer, the corrugated body and the end faces are advantageously formed of a material that is highly thermally conductive to facilitate transfer of thermal energy from the module thermal interface to one or more of the rails. One example of such a material is metal but the solution disclosed herein is not limited in this regard. If the contoured plates 310 are metal, the bellows 303 can be manufactured by alternately welding the inner and outer diameter of each plate at a periphery thereof corresponding to the root and crest portions. To facilitate control of the fluid pressure, a fluid interface 308 with a suitable fluid orifice (not shown in 3A-3C) can be provided on a portion of the bellows to facilitate a flow of fluid into and out of the bellows capsule.

When a fluid in the bellows capsule is at atmospheric pressure, the bellows length L will have some predetermined nominal length. The bellows length L can be changed relative to the nominal length when the fluid pressure is increased or decreased relative to atmospheric pressure. The amount of change in distance L responsive to changes in fluid pressure will depend on certain physical characteristics of the bellows construction. The techniques and methods for designing and manufacturing of a metal bellows to achieve various expansion and contraction properties are well-known and therefore will not be described here in detail. However, one or more of the bellows characteristics which can be selected by a designer to control such expansion and contraction properties in a particular application include inner/outer diameter dimensions of the contoured plates and the plate thickness.

In some scenarios, the arrangement of the contoured plates forming the stack 307 can comprise a spring whereby the first and second end faces can be resiliently compressed and exert a spring force upon an object. The techniques and methods for designing and manufacturing of a metal bellows to achieve various spring constants are well-known and therefore will not be described here in detail. However, one or more of the bellows characteristics which can be selected by a designer to control such spring properties in a particular application include inner/outer diameter dimensions of the contoured plates and the plate thickness.

Figures 5A, 5B:
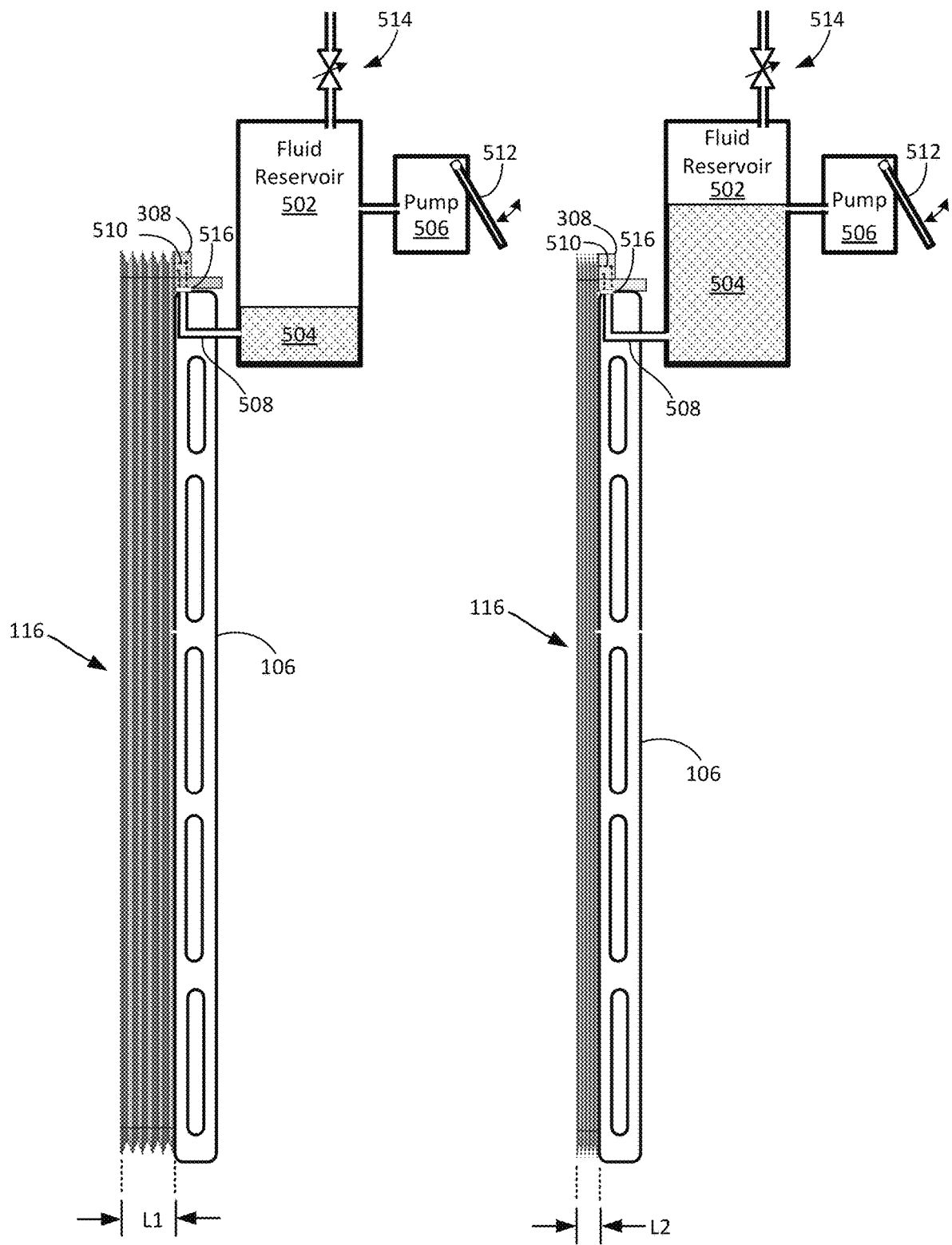
FIGS. 5A-5B are a series of drawings that are useful for understanding an operation of the bellows in the electronics chassis.

A schematic drawing useful for understanding a system for controlling bellows length L is shown in FIGS. 5A and 5B. The system can include a fluid reservoir 502 containing a fluid 504 and a pump 506 which is used to increase and/or decrease a fluid pressure relative to an environment (e.g., atmospheric pressure). The fluid 504 can be any suitable hydraulic fluid that is chosen for compatibility with the material forming the bellows capsule. In some scenarios, the pump can be a hand pump which is integrated with the chassis in which one or more of the modules are inserted. The hand pump can be manually operated by an actuator 512. The system can also include a pressure release valve 514 coupled to the reservoir. The pressure release valve may be used for equalizing the fluid pressure of the fluid with the pressure of an environment surrounding the retainer 116. The reservoir is in fluid communication with the bellows capsule 309 disposed internal of the retainer. For example, this can be facilitated by a fluid manifold 508 and a fluid conduit or passage 510. According to one aspect, the fluid manifold 508 may be at least partially integrated into the rail 106. In some scenarios, the fluid conduit 510 can be defined within the fluid interface 308 which is formed integral with the retainer 116. A seal 516 can be provided to ensure that pressurized fluid 504 is retained within the system at a connection between the fluid conduit and the fluid manifold. The fluid conduit is open to the interior portion of the bellows defined by the bellows capsule 309. The entire system is sealed to prevent fluid pressure from being relieved through means other than the pressure relief valve 514 or the pump 506. Accordingly, fluid pressure in the bellows capsule 309 is controlled by the pump and/or the pressure relief valve.

The retainer 116 will have a predetermined nominal bellows length L when the fluid within the bellows capsule is equivalent to an atmospheric pressure or pressure of a surrounding environment. When fluid pressure in the bellows capsule can be increased relative to atmospheric pressure as shown in FIG. 5A, the bellows length L is increased (relative to the nominal length) to L1 as shown. Conversely, when fluid pressure in the reservoir is decreased relative to atmospheric pressure, the bellows length L can be decreased (relative to the nominal length) to L2, where L1>L2.

Figure 6A:
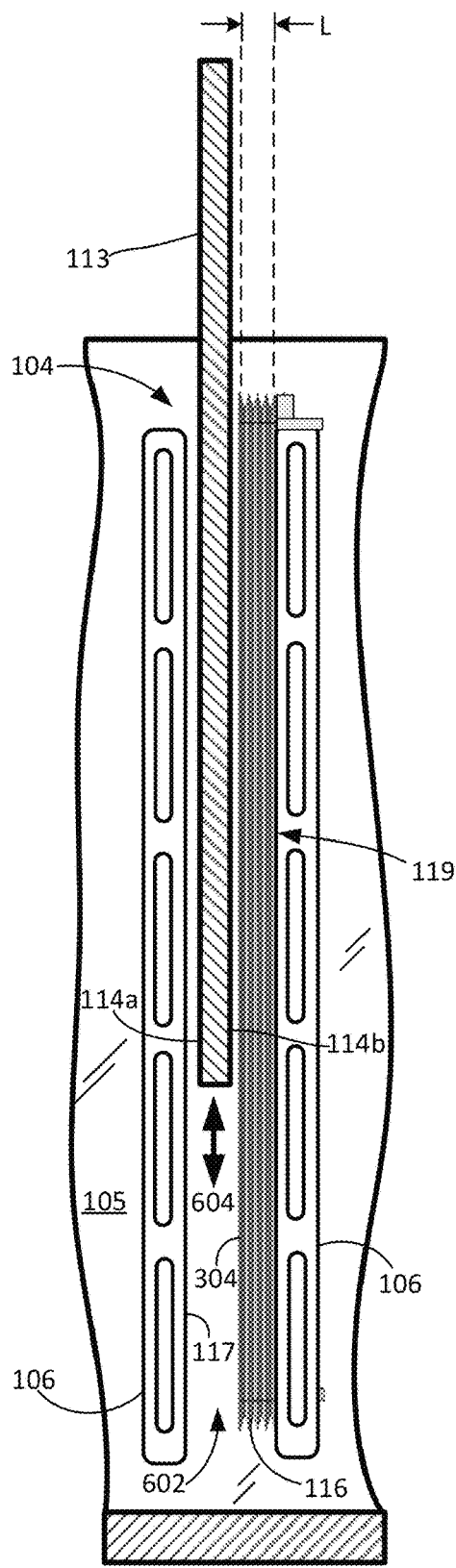
FIG. 6A-6B are a series of drawings that are useful for understanding how the bellows can releasably retain and facilitate thermal conduction for a plug-in module in the electronics chassis.
Figure 6B:
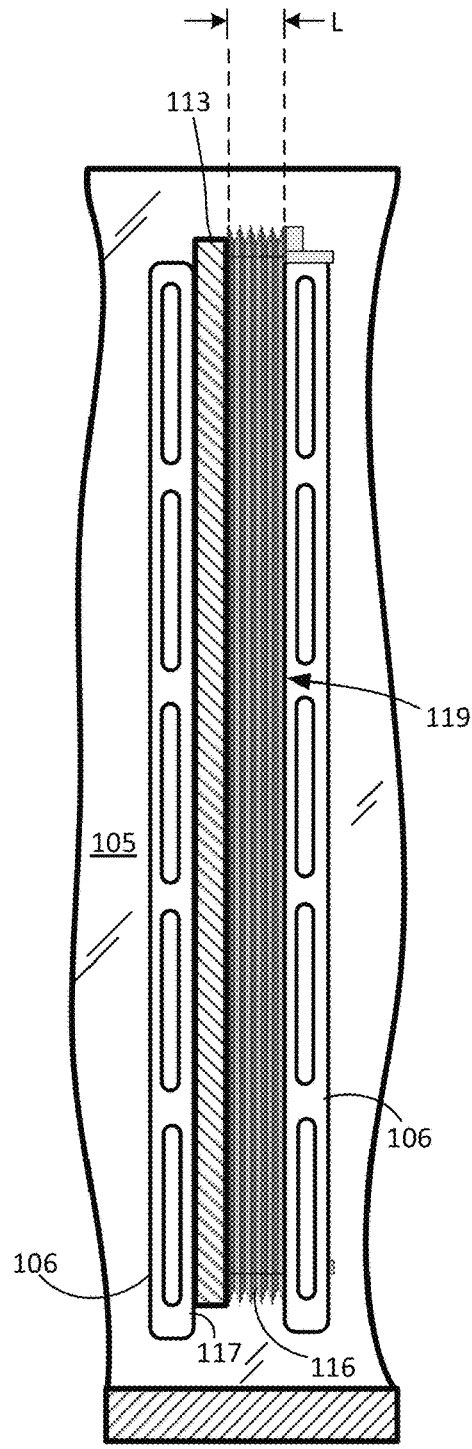

The variation in length L can be used to help secure module 108 in a slot 104 and to help facilitate transfer of thermal energy from the module to a cold wall (e.g., side panel 102) of an electronic chassis. To understand this function, FIGS. 6A and 6B show a schematic interaction of a retainer 116 with elongated guide members 113 of a module. In FIG. 6A a bellows length L of retainer 116 is reduced to create a clearance space 602 in a slot of an electronics chassis. In some scenarios this can be facilitated by using the pressure relief valve 514 to equalize the fluid pressure in the bellows capsule to a pressure of an environment (e.g., atmospheric pressure) in which the retainer is disposed. In other scenarios, the clearance space can be formed by using the pump 506 to reduce the fluid pressure in the bellows capsule to be less than a pressure of a surrounding environment in which the retainer is disposed.

According to one embodiment, the clearance space 602 can be formed between an end face 304 of the retainer 116 and a planar rail face 117 of a rail 106 which is opposed from the end face. The resulting clearance space 602 is sized and shaped so as to permit a guide member 113 of a module 108 to move freely in the clearance space in the directions 604 aligned with the length of the slot. Once the module is in a desired position (e.g., fully inserted in the slot) it is advantageously secured by changing the internal pressure of the bellows. In particular, the pressure of in the bellows capsule can be increased so that an increase in the bellows length urges the planar surface of end face 304 into firm engagement with the planar face 114b. The force applied by the retainer will also urge the planar face 114a to firmly engage rail face 117. The engagement of these thermal interface portions of the guide member 113 will facilitate transfer of thermal energy from module 108 to the rails 106. In particular, thermal energy will be transferred from planar face 114a to the rail face 117. The direct path from planar face 114a to rail face 117 will remain a primary path for thermal energy due to the direct contact provided between the two surfaces. However, an advantage of the bellows type retainer system is that thermal energy can also be transferred efficiently from planar face 114b through the retainer 116 to the rail face 119. In various embodiments, the force applied by the retainer 116 on the guide member can be facilitated by the hydraulic pressure in the bellows capsule and/or by the spring force developed by the bellows.

It may be noted that there are basically two thermal paths through the retainer 116 described herein. A first thermal path is through the mechanical components of the bellows including the end faces 304, 306 and the corrugated body formed of contoured plates 310. A second thermal path exists through the fluid contained within the bellows capsule. Accordingly, a further design consideration when selecting a hydraulic fluid can include the fluid thermal conductivity. The fluid used in the solution can be advantageously selected or configured to have a relatively high thermal conductivity. It is well-known that many metals and certain non-metals in solid form have thermal conductivities that are orders of magnitude greater as compared to thermal conductivities of fluids. Accordingly, in some scenarios the thermal conductivity of the fluid contained within the bellows capsule can be enhanced by suspending metallic and/or non-metallic nanoparticles within the fluid. For purposes of enhancing thermal conductivity, metallic and non-metallic nanoparticles having a size of less than 100 nm are preferred. Known metallic and nonmetallic nanoparticles which are useful for increasing thermal conductivity of a fluid include particles such as $Al_2O_3$, $CuO$, $Cu$, $SiO_2$, $TiO_2$. However, the solution is not limited in this regard and any combination of fluid and particle can be used provided that it is compatible with the bellows.

Figure 7:
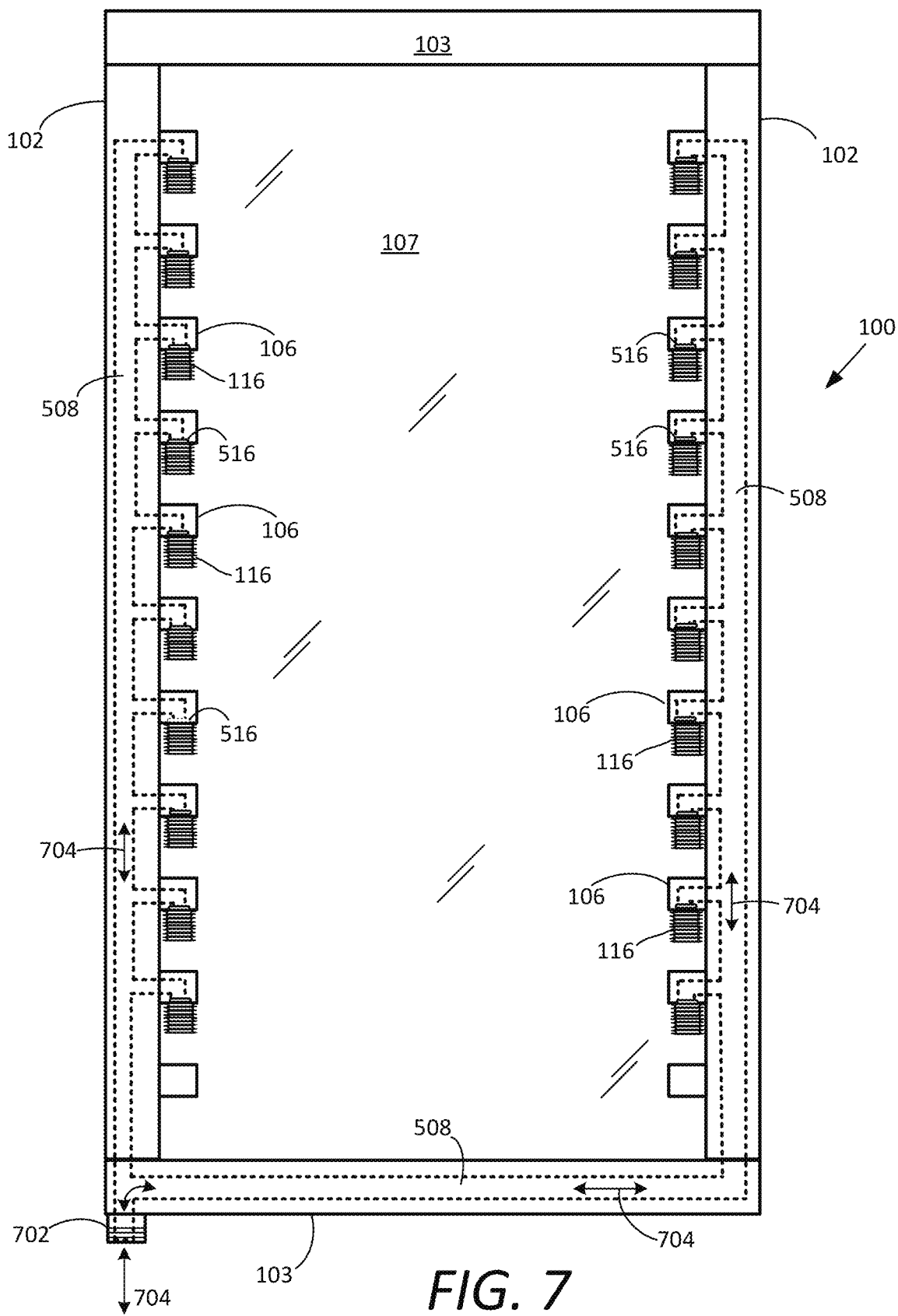
FIG. 7 is a drawing that is useful for understanding a hydraulic fluid manifold system that can be used to concurrently operate a plurality of bellows in the electronics chassis.

Any suitable arrangement of one or more fluid pathways can be used for coupling hydraulic fluid from the fluid reservoir 502 to the bellows capsule 309. However, in some scenarios it can be advantageous to integrate one or more of such fluid pathways into the panels which form the electronics chassis This concept is illustrated in FIG. 7 which shows how a fluid manifold 508 can be integrated into the side panels 102 and end panel 103 of the electronics chassis 100. The fluid manifold 508 provides a sealed passage through which hydraulic fluid in the fluid reservoir can be in fluid communication with the bellows capsule 309. A pressure fitting 702 can be provided to facilitate a coupling of the fluid manifold with the fluid reservoir 502, pump 506 and pressure relief valve 514. Seal 516 can be provided at each rail 106 to ensure that pressurized fluid does not escape at a connection between the retainer and the rail. Suitable sealing members can be provided According to one aspect, the fluid manifold 508 may extend into and through an interior of one or more rails 106 to facilitate a fluid coupling to the retainers 116. With the arrangement shown, hydraulic fluid can move in directions indicated by arrows 704 to increase and/or decrease the pressure in each bellows as required.

Reference throughout this specification to features, advantages, or similar language does not imply that all of the features and advantages that may be realized should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout the specification may, but do not necessarily, refer to the same embodiment.

Furthermore, the described features, advantages and characteristics disclosed herein may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments.

Reference throughout this specification to "one embodiment", "an embodiment", or similar language means that a particular feature, structure, or characteristic described in connection with the indicated embodiment is included in at least one embodiment. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the embodiments have been illustrated and described with respect to one or more implementations, equivalent alterations and modifications will occur to others skilled in the art upon the reading and understanding of this specification and the annexed drawings. In addition, while a particular feature of an embodiment may have been disclosed with respect to only one of several implementations, such feature may be combined with one or more other features of the other implementations as may be desired and advantageous for any given or particular application. Thus, the breadth and scope of the embodiments disclosed herein should not be limited by any of the above described embodiments. Rather, the scope of the invention should be defined in accordance with the following claims and their equivalents.

We claim:

1. A method for retaining an electronics module in a slot of an electronics chassis, comprising:
   creating a clearance space for receiving the electronics module in the slot of the electronics chassis by controlling an internal pressure of a bellows which forms a part of a retainer that is disposed on an elongated rail extending along a length of the slot, wherein the bellows comprises two opposing sidewalls that are each formed of a plurality of plates coupled to each other to form a resilient member;
   varying an internal pressure of the bellows to change a distance between adjacent ones of the plurality of plates forming the resilient member; and
   securing the electronics module with the retainer after it has been received in the slot by further controlling the internal pressure of the bellows until the resilient member exerts a force on the electronics module.

2. The method of claim 1, wherein the bellows defines a bellows capsule which contains a fluid.

3. The method of claim 2, wherein the fluid is comprised of a base fluid and the method further comprises enhancing a thermal conductivity of a fluid path through the bellows by adding to a base fluid at least one of a metallic and a non-metallic nanoparticles.

4. The method of claim 2, further comprising using the fluid to concurrently control the internal pressure of at least a second bellows associated with a second retainer disposed on a second elongated rail of the electronics chassis.

5. The method of claim 2, further comprising controlling the internal pressure using a pump.

6. The method of claim 5, further comprising integrating the pump with the electronics chassis.

7. The method of claim 1, further comprising controlling the internal pressure by selectively varying a condition of a pressure relief valve.

8. The method of claim 1, further comprising selecting a highly thermally conductive material to form the bellows.

9. The method of claim 8, further comprising selecting the thermally conductive material to be a metal.

10. The method of claim 1, further comprising using the bellows to conductively cool the electronics module by transferring thermal energy through the bellows, from a thermal interface of the electronics module to the elongated rail.

11. The method of claim 5, further comprising using a fluid manifold to distribute fluid pressure developed by the pump to concurrently control the internal pressure of a plurality of the bellows in a plurality of slots.

12. An electronics chassis, comprising
   at least one slot of predetermined size and shape which is disposed between opposing first and second chassis walls for receiving therein a specified module;
   a retainer disposed in the at least one slot, the retainer comprising a bellows which comprises two opposing sidewalls that are each formed of a plurality of plates coupled to each other to form a resilient member;
   the bellows in a first state having a first bellows length which facilitates a clearance space within the at least one slot for receiving the specified module, and in a second state having a second bellows length greater than the first bellows length whereby a force can be exerted by the resilient member on a portion of the specified module when the module is in the at least one slot;
   wherein the bellows has an internal bellows capsule configured for containing a fluid, and the bellows is configured to transition from the first state to the second state responsive to a change in a fluid pressure in the bellows capsule; and
   wherein a distance between adjacent ones of the plurality of plates forming the resilient member is changeable by varying the fluid pressure in the bellows capsule.

13. The electronics chassis of claim 12, wherein the at least one slot is at least partially defined by a plurality of rails which extend along the first chassis wall, the retainer disposed on a first face of a first rail opposed from a second face of a second rail, and the clearance space is between the retainer and the second face.

14. The electronics chassis of claim 12, further comprising a fluid control system configured to control the fluid pressure.

15. The electronics chassis of claim 14, wherein the fluid control system is comprised of one or more of a pump, a fluid reservoir, a fluid manifold, and a pressure relief valve.

16. The electronics chassis of claim 12, wherein at least one fluid pathway coupled to the bellows capsule is formed within the first chassis wall.

17. The electronics chassis of claim 13, wherein at least one fluid pathway coupled to the bellows capsule extends through the first rail.

18. The electronics chassis of claim 12, wherein the resilient member is a spring capable of exerting a spring force.

19. The electronics chassis of claim 18, wherein the force that is exerted on a portion of the specified module when the module is in the at least one slot is produced by at least one of a fluid pressure within the bellows capsule and the spring force exerted by the resilient member.

20. The electronics chassis of claim 12, wherein the bellows is formed of a metal.

21. The electronics chassis of claim 12, wherein the fluid is comprised of a base fluid and at least one of a metallic and a non-metallic nanoparticles which enhance a thermal conductivity of the base fluid.

* * * * *